May 27, 1969 W. H. GROTH 3,447,148

DIGITAL TO ANALOG CONVERTER HAVING DIGITAL FEEDBACK

Filed Oct. 18, 1965

INVENTOR.
WILLIAM H. GROTH
BY Arthur H. Swanson
ATTORNEY.

INVENTOR.
WILLIAM H. GROTH
BY Arthur H. Swanson
ATTORNEY.

United States Patent Office 3,447,148

Patented May 27, 1969

3,447,148
DIGITAL TO ANALOG CONVERTER HAVING DIGITAL FEEDBACK

William H. Groth, Douglasville, Pa., assignor to Honeywell Inc., Minneapolis, Minn., a corporation of Delaware Filed Oct. 18, 1965, Ser. No. 496,995
Int. Cl. H03k 13/02, 13/32
U.S. Cl. 340—347 8 Claims

ABSTRACT OF THE DISCLOSURE

There is provided a digital to analog converter system which includes a feedback arrangement which operates in a digital manner whereby the digital to analog converter is monitored, for example by a digital computer.

This invention relates to data-handling apparatus. More specifically, the present invention relates to digital to analog converters.

An object of the present invention is to provide an improved high speed digital to analog converter.

Another object of the present invention is to provide an improved digital to analog converter with digital feedback checking of the conversion operation.

Another object of the present invention is to provide an improved digital computer analog output system having internal checking of an analog output signal.

In accomplishing these and other objects, there has been provided, in accordance with the present invention, a digital to analog converter system having a digital to analog converter producing a train of pulses each having a selectively variable duration to determine the amplitude of an analog output signal through integration of the pulses of the pulse train. The pulse train is produced by varying a count in a counter for counting clock pulses. These clock pulses are counted, also, in a digital feedback system to obtain a digital representation of the value of the analog output signal for checking by a digital computer.

A better understanding of the present invention may be had when the following detailed description is read in connection with the accompanying drawings in which.

Figures 1, 2:
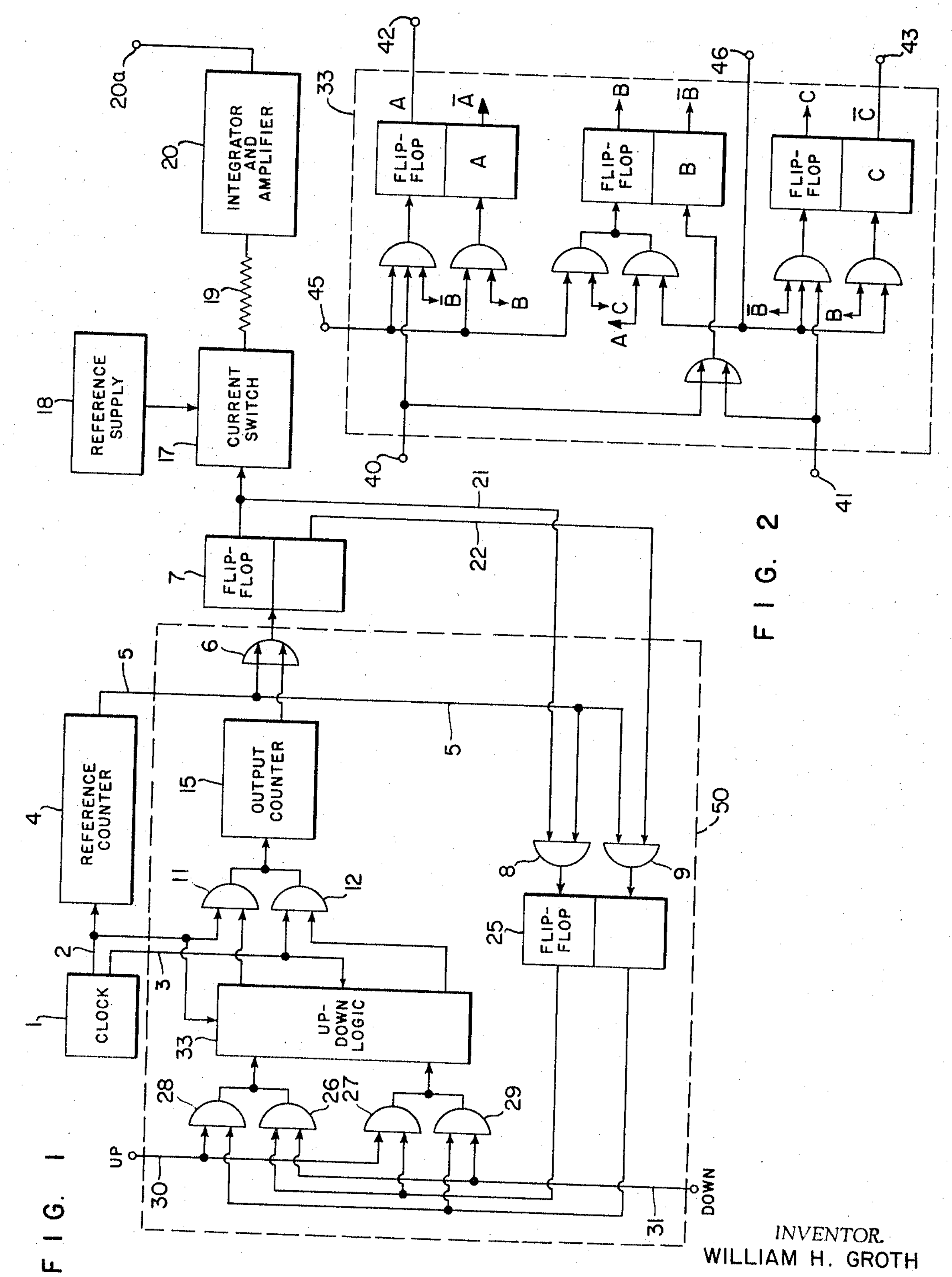
FIG. 1 is a schematic representation of a digital to analog converter for use with the present invention.
FIG. 2 is a schematic illustration of an up-down logic circuit suitable for use in FIG. 1.

Referring to FIG. 1 in more detail, there is shown a digital to analog converter, hereinafter referred to as a D/A converter, for use with the present invention. The D/A converter is described in the copending application, Ser. No. 497,369, entitled Eelectrical Apparatus, by W. H. Groth, which is assigned to the same assignee and which comprises a clock, or free-running oscillator, 1 arranged to produce a pulse train at a predetermined frequency; e.g., one megacycle. A high frequency clock signal tends to reduce the ripple content at the analog output. The output signals from the clock 1 are arranged to alternate between a pair of clock output lines 2, 3 at the aforesaid frequency. Thus, the signal produced on line 3 is the complement of the signal produced on line 2. A first clock output line 2 is connected to the input circuit of a reference binary counter 4. This counter may be any standard counter known in the art. For example, the counter may include one or more known types of flip-flop circuits. The output circuit of the counter 4 is arranged to produce an output signal for each full binary count; e.g., a count of 1,024 input pulses. This output signal is applied over line 5 to an "or" gate 6. An output signal from gate 6 is fed to a first flip-flop 7 to switch the flip-flop 7 between its alternate states. Typically, the flip-flops described may be, but are not limited to, A.C. flip-flops which trigger on the trailing edge of the input signal. Also, the reference counter output signal is connected over line 5 to a first and a second "and" gate 8 and 9 as a first input signal thereto.

The first clock line 2 is, also connected to a third "and" gate 11 as a first input signal thereto. The second clock output line 3 is connected to a fourth "and" gate 12 as a first input signal thereto. The output signals from the "and" gates 11, 12 are connected together and are applied to the input circuit of a second binary counter 15 similar to the first counter 4. That is, counter 15 produces an output signal for a full binary count which may be 1,024 as in the case of counter 4. An output signal from the second binary counter 15 is connected to an input to "or" gate 6 and, from gate 6, is applied to flip-flop 7. The output signal from one side (e.g. Set) of the first flip-flop 7 is connected to a current switch, or gate, 17 which is effective to supply a predetermined and substantially constant amplitude signal from a reference supply 18. This signal is applied through a resistor 19 to an averaging, or integrating and amplifying circuit 20. The output signal from the averaging circuit 20 is applied to an averaging output terminal 20*a* as an analog output signal. Thus, the analog output signal is a direct function of the duration of the constant amplitude signal produced by reference supply 18. The duration of the signal is controlled by flip-flop 7 as is described hereinafter.

The output signal from the first side of the flip-flop 7 is, also, applied as a second input signal to the first "and" gate 8 over line 21. Similarly, the output signal from the second (e.g. Reset) side of the flip-flop 7 is applied as a second input signal to the second "and" gate 9 over line 22. The output signals from the "and" gates 8, 9 are applied to opposite input sides of a second flip-flop 25. The output signals from the respective sides of second flip-flop 25 are applied as first input signals to respective fifth and sixth "and" gates 26, 27 from one side of flip-flop 25 and seventh and eighth "and" gates 28, 29 from the other side of flip-flop 25. The second input signal for the sixth and seventh "and" gates 27, 28 is obtained from a digital signal input line 30 indicated operatively as an "up" line. Similarly, the second input signal for the fifth and eighth "and" gates 26, 29 is obtained from a digital signal input line 31 operatively labeled as a "down" line. The "up" and "down" signals may be provided by any suitable control means.

The output signals from the fifth and seventh "and" gates 26, 28 are both connected to a first input circuit of an up-down logic circuit 33. The output signals from the sixth and eighth "and" gates 27, 29 are both connected to a second input circuit of the logic circuit 33. The up-down logic circuit 33 is used to control the third and fourth "and" gates 11, 12 to selectively gate the clock signals on the clock lines 2 or 3 to the counter 15. In other words, the output signals from the up-down logic circuit 33 are applied as second input signals to "and" gates 11 and 12, respectively, to determine which of these gates is conductive. The condition of gates 11 and 12 determines which of the signals on clock line 2 or 3 are introduced into counter 15. The clock lines 2, 3, are, also, connected to provide synchronizing signals to the logic circuit 33. A suitable logic circuit for use as the up-down control 33 is shown in FIG. 2. A first input terminal 40 is provided for connection to the gates 26 and 28. A second input terminal 41 is connected to the gates 27 and 29. A pair of output terminals 42 and 43 are connected to the gates 12 and 11, respectively. A first synchronizing terminal 45 is provided for connection to the first clock line 2 while a second synchronizing terminal 46 is connected to the second clock line 3. The synchronizing connections are utilized to accurately control the number of clock pulses operated on during an up or down input signal. For purposes of clarity, a number of the internal connections of FIG. 2 have been indicated with letters as the destination of these connections on the three flip-flops A, B, and C.

In operation, the D/A converter of the present invention is effective to convert a digital signal comprising a train of pulses to an analog output signal which can be used to perform direct adjustments of analog devices. Thus, the present invention is effective to allow a digital computer to control analog process control devices; e.g., valves, by effecting a continuous digital to analog conversion. The present invention is, also, arranged to act bidirectionally to enable the analog output signal to be either increased or decreased, as desired, in order to continuously respond to digital input commands. Basically, the D/A converter is arranged to produce an analog output signal on terminal 20*a* which represents the difference in count between the counters 4 and 15. These counters are normally arranged to count the clock pulses from the clock 1 on line 2. These pulses are fed directly to the reference counter 4 on line 2 and through a normally open gate; i.e., gate 11, to the output counter 15. At the end of each full cycle binary count, the counters 4, 15 are each effective to produce an output signal which is passed through "or" gate 6 to the flip-flop 7. Since the output of the "or" gate 6 is applied to the complementing, or toggle, input of the flip-flop 7, each pulse output from the gate 6 is effective to change the state of the flip-flop 7. The output signal in the form of a pulse train from one side of the flip-flop 7 is applied to a current switch 17 to allow a substantially constant amplitude current flow from the reference supply 18 to the integrator 20 during the duration of each flip-flop pulse. The integration and amplification of this current flow by the integrator 20 is effective to produce a continuous analog output signal on the output terminal 20*a*. Thus, the continuing pulse train from the flip-flop 7 is effective to maintain a corresponding analog signal output from the integrator 20. That is, in the absence of a change in the pulse rate from flip-flop 7, the analog output signal remains constant.

In order to change the analog output signal in response to digital input commands on either the "up" terminal 30 or the "down" terminal 31, the D/A converter is provided with means to change the count in the output counter 15 with respect to the reference counter 4. This count change is achieved by either adding a pulse to the output counter 15 on line 3 or preventing a pulse on line 2 from reaching the counter 15. Under either of these conditions, the output signal from the output counter 15 shifts in time relation with respect to the output signal from the reference counter 4. Thus, the flip-flop 7 is actuated at different times to change its state from the previous switching times whereby the duration of the pulses in the pulse train supplied to the integrator 20 is varied. Specifically, if a pulse is added to the output counter 15, the count cycle is completed sooner. Therefore, the duration of the pulse supplied to integrator 20 is decreased since the flip-flop 7 is switched sooner and switch 17 is closed sooner. This decrease in pulse duration is effective to proportionally decrease the analog output signal. On the other hand, if an input pulse is deleted from the output counter 15, the flip-flop 7 is switched later, and the analog output signal is increased. It will be noted that the addition or deletion of a single pulse to the counter (1,024 counts) permits a step or change having about 0.1% full-scale resolution.

The alternate clock line 3 is used as a supply of additional pulses to the output counter 15 through gate 12. Gate 11 is used to delete a clock pulse on line 2 from the output counter 15. These gates are controlled by the up-down logic 33 in response to digital commands on either input terminal 30 or 31. The up-down logic 33 is a conventional resetting logic circuit which is normally effective to allow gate 11 to be opened and all clock pulses on line 2 to be applied to the output counter 15. A suitable logic circuit employing coventional elements is shown in FIG. 2. This logic circuit is normally arranged to hold gate 11 in an open condition by having an output $\bar{C}$ from flip-flop C appear on the side connected to gate 11. Flip-flop A is used to control the opening of gate 12 to add an additional pulse from line 3 to the output counter 15 to decrease the analog output signal. The up-down logic 33 is arranged to reset itself to either reopen gate 11 or to reclose gate 12 after the desired action has been achieved in response to a prior digital command. This resetting action allows clock pulses on line 2 to be reapplied to the output counter 15.

The gates 8, 9, the flip-flop 25 and the gates 26, 27, 28 and 29 are arranged as a logic circuit to effect an end stop when the analog output signal has reached a maximum excursion in either an increase or decrease direction. Such a maximum excursion would be indicated by a reversal of the effect of the output signals from the counters 4 and 15, i.e., the reference counter 4 would be turning on the pulses in the pulse train supplied by the flip-flop 7 and the output counter 15 would be turning off these pulses. That is, counter 15 would have decremented to the point where it had fallen behind counter 4 and the actual "subsequent pulse" would appear as a virtual "prior pulse." This reversal would result in further digital decrease commands resulting in an increase in the analog output signals and vice versa. The aforesaid logic components are used to detect this condition and to reverse the effect of the up-down digital commands whereby the analog signal would substantially remain at its maximum excursion. Specifically, the digital commands would have a reverse effect as soon as a maximum excursion was reached to reverse the course of the analog signal and a normal condition would be reinstated when less than a limit condition was present. The reversed state would then be provided if the limit value; i.e., either maximum or minimum, was again passed. Thus, the analog output signal would be kept at its limit value with a small deviation to one side while the digital commands could continue to direct a change after the limit was reached without any further effect. To effect this operation, gate 8 is used to sense the presence of an output signal on line 5 at the same time that flip-flop 7 is "on." This coincident condition is used to trigger flip-flop 25 in order to divert the "up" digital commands on line 30 to the up-down logic 33 by enabling gate 27 in place of the "down" commands. The restoring of the "up" commands to the normally up side of the up-down logic 33 is performed by gate 9 triggering flip-flop 25 to its opposite state to open gate 28. Gate 9 is enabled by the concurrent application of input signals thereto by counter 4 (via line 5) and the second, or Reset, side of flip-flop 7. Similarly, the "down" digital commands are interchanged through gates 26 and 29 under the control of flip-flop 25.

Figure 3:
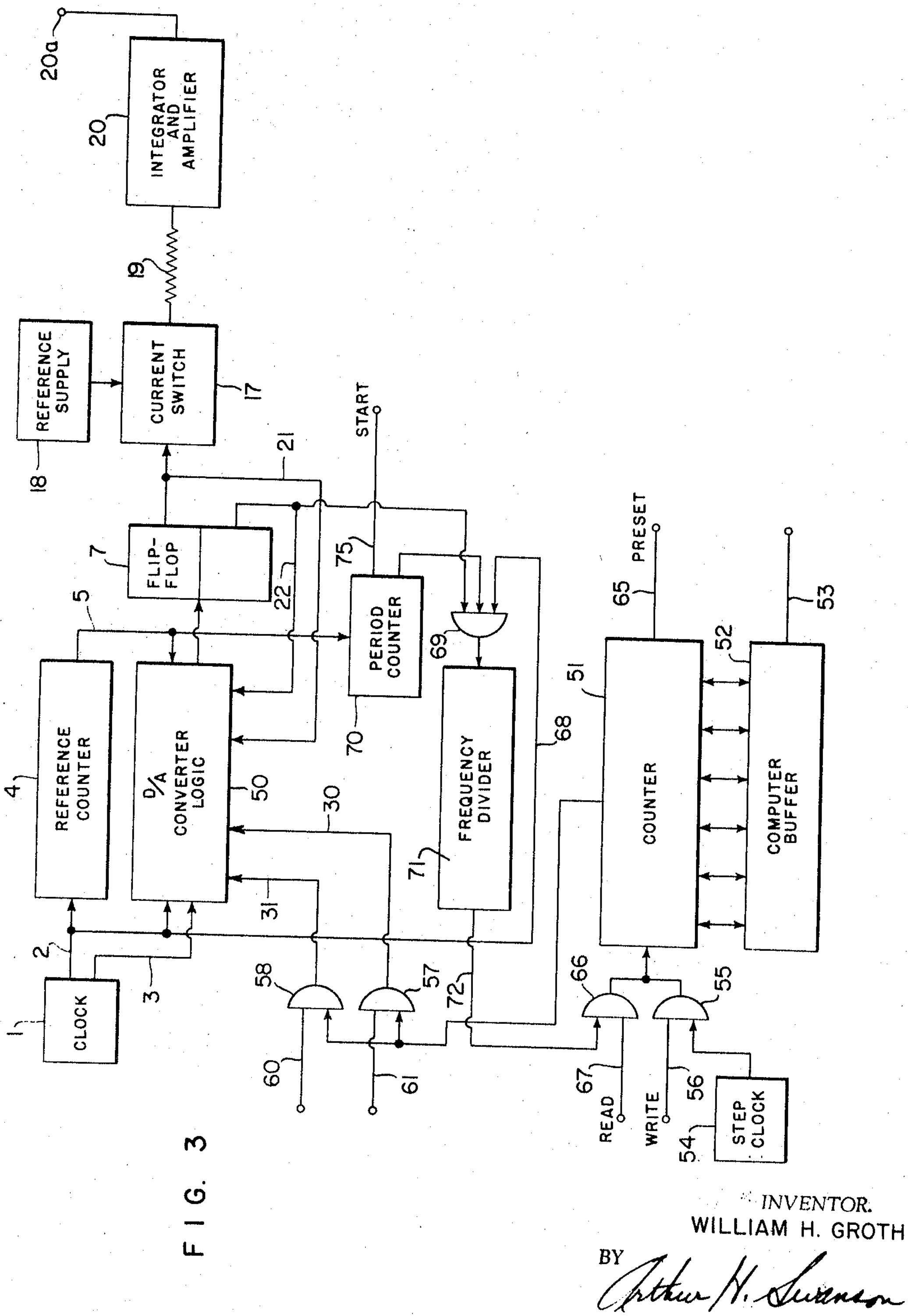
FIG. 3 is a block diagram of a digital computer analog output system embodying the present invention.

Referring to FIG. 3, there is shown digital computer analog output system embodying the present invention. Similar reference numbers are used in FIG. 3 for elements shown in FIG. 1 which are redrawn in FIG. 3 for purposes of illustration. The general D/A converter logic shown in detail in FIGS. 1 and 2 (the material of which is included within dashed outline 50 of FIGURE 1) is represented by a logic block 50 in FIGURE 3. The system shown in FIGURE 3 is effective to provide a digital feedback to a digital computer or similar device as an indication of the existing analog output signal. In order to provide the feedback signal, the number of clock pulses from the clock 1 are counted for each "off" duration of the flip-flop 7. The counting operation is performed for a preset number of pulse durations from the flip-flop 7; e.g., 16, in order to provide a count signal which may be subdivided by the number of count cycles for subsequent transmission. This count signal is fed to decrementing counter 51 which is used to provide the up-down digital commands to the converter logic circuit 50. The state of the counter after counting the feedback signals is transferred to the computer to indicate the value of the analog output signal.

As shown in FIG. 3, a binary counter 51 is used to store the desired analog change, as a digital value comprising the number of steps required to bring the present analog output signal at output terminal 20*a* to a desired new level. This digital value is transferred from a computer buffer storage circuit 52 to counter 51 by a shift signal on input terminal 53. A step clock 54 is used to provide pulses to the counter 51 to step the counter back to zero. When counter 51 is stepped to zero, the aforesaid desired change in the analog signal is essentially effected. The pulses from the clock 54 are gated through an "and" gate 55 which gate is opened by a computer "write" signal applied over a gate line 56. This stepping of the counter 51 is effective to provide the digital input pulses for the logic circuit 50 through a pair of gates 57, 58 which are used to steer the digital pulses to either the "up" or "down" lines 30, 31. The gates 57, 58 are controlled by computer enable signals on separate gate lines 60, 61 which are used to determine whether the analog output signal is to be increased or decreased by the D/A converter as previously described.

After the counter 51 reaches zero, the change in the analog output signal is terminated and the analog signal is retained at a balance level as discussed above. This balance level may be read at any time by using the digital feedback system shown in FIG. 3. In order to read the value of the analog output signal, the number of pulses provided by clock 1 during each "off" state of the flip-flop 7 is fed into the counter 51. The counter 51 is preconditioned to accept these signals by a preset signal applied from the computer over a line 65 which is effective to set the counter 51 to have a maximum count, i.e., all "ones." Additionally, the gate 55 is closed and a feedback read gate 66 is opened by a computer signal on a "read" line 67. The clock signals from the clock 1 are applied over a line 68, which is connected to the clock output line 2, as one input to a three input "and" gate 69. Another input to the gate 69 is taken from the output of the reference counter line 5 by means of a period counter 70. The counter 70 is used to count the number of pulse duration cycles, for example 16 cycles, during which the clock cycles are to be counted. When this count is reached by the counter 70, the gate 69 is closed. In order to count clock pulses from the clock 1 representative of the value of the analog output signal by the counter 51, the clock pulses during the "off" state of the flip-flop are counted. These clock pulses step the counter 51 from its full count toward zero. Thus, gate 69 is open only during the time the flip-flop 7 is in its alternate state from that used to turn on the current switch 17. The state of flip-flop 7 is the third input to gate 69 and is also connected to the logic input line 22 to the logic circuit 50. Accordingly, the gate 69 is open to clock pulses only during the "off" period of flip-flop 7.

After the predetermined number of count periods, the period counter 70 is effective to close gate 69 to terminate the feedback count. A "start" signal from the digital computer over a "start" line 75 may be used to reset the counter 70 to restart the feedback cycle at the time the read gate 66 is open. The output signal from the gate 69 is applied to a frequency divider 71 which is effective to divide the pulses provided by the gate 69 by the number of count periods set into the period counter 70 in order to produce a proper digital feedback signal over a feedback line 72 connected to gate 66. The count in the counter 51 at end of the feedback cycle is transferred into the buffer 52 and, ultimately, back into the computer as an indication of the existing analog output signal. It is to be noted that the present invention may be used with a number of D/A converters by providing multiplexing means to feed a selected D/A counter signal into the feedback logic while the counter 51 would be preset for each checking operation over the preset line 65.

Accordingly, it may be seen that there has been provided, in accordance with the present invention, an improved D/A converter system having means for checking the value of an existing analog output signal by a digital computer.

What is claimed is:

1. A digital feedback system comprising, a digital to analog converter including a first means operative to produce a first train of pulses having a selectively variable number per unit time, a second means operative to produce a second train of pulses having a fixed number per unit time, flip-flop means arranged to switch between alternate states in response to pulses from either said first or second train of pulses, integrator means arranged to respond to one of the states of said flip-flop to produce an analog output signal, a clock means arranged to drive said first and second means with constant frequency clock pulses, counter means, and gate means arranged to apply said clock pulses to said counter during the time of one of the states of said flip-flop and a coincident output pulse from said second means.

2. In combination, means for supplying regularly recurring signals, means for counting said signals, converter means, said converter means including further means for counting said signals and means for selectively varying the rate at which said further means counts, bistable means selectively switchable by each of said counting means, output means controlled by said bistable means, said output means being operatively only when said bistable means is in one stable state, gating means connected to said bistable means and said means for supplying signals such that said signals are passed by said gating means only when said output means is inoperative, means for detecting the signals passed by said gating means, means for receiving information from said means for detecting which information is indicative of the signals detected thereby, said means for receiving information adapted to operate on said information and to generate further information based on said first named information and selectively insert said further information into said detecting means, means for controlling said detecting means, and means for transferring said further information from said detecting means to said converter means responsive to said means for controlling whereby said converter means has the rate of counting varied.

3. The combination recited in claim 2 wherein said bistable means comprises flip-flop means, said gating means connected to said flip-flop to receive a signal therefrom only when said flip-flop is not in said one stable state, said detecting means includes a counter means, and control means selectively passing signals from said gating means to said computer means, said counter means operative for counting signals produced by said means for supplying regularly recurring signals only when said gating means is enabled by said flipflop means not being in said one stable state and when said control means selectively passes signals.

4. The combination recited in claim 2 wherein said means for receiving information comprises computing equipment means including a read-write buffer element.

5. In combination, means for supplying regularly recurring signals, first means for counting said signals and producing an output for a predetermined number thereof, second means for counting said signals and producing an output for a predetermined number thereof, bistable means switchable from one state to another by the output from each of said counting means whereby the operation of said bistable means in each state is a function of the rate at which outputs are produced by said first and second counting means, analog output means controlled by said bistable means, said analog output means being operative only when said bistable means is in one stable state, gating means connected to said bistable means and said means for supplying signals such that said signals are passed by said gating means only when said analog output means is inoperative, means for detecting the signals passed by said gating means, digital computing means for receiving information from said means for detecting which information is indicative of the number of signals detected thereby, said digital computing means for receiving information adapted to operate on said information and to generate further information based on said first named information and to selectively insert said further information into said detecting means, and means for controlling said detecting means whereby said further information is selectively transferred from said detecting means to said second counting means to alter the counting sequence thereof.

6. The combination recited in claim 5 wherein said information is indicative of the condition at said analog output and said further information is indicative of a desired change, said second means for counting including means for advancing or delaying the count sequence in response to the further information selectively transferred from said detecting means whereby the outputs from said first and second means for counting occur at smaller or larger intervals and control the analog output means via said bistable means.

7. In combination, means for supplying clock signals and the complements thereof, reference counting means for counting said clock signals, converter means for counting said complements of said clock signals, said reference counting means and said converter means each producing signals after a predetermined count is achieved, switch means connected to said reference counting means and said converter means, said switch means having the condition thereof altered by each signal produced by said reference counting means and said converter means, output means operative only when said switch is in a first condition, period counter means for producing an output signal for a predetermined number of output signals from said reference counting means, gate means producing output signals only in response to coincident signals from said clock signal supplying means, said period counter means and said switch means in a second condition, frequency dividing means for operating on said output signals produced by said gate means to reduce the frequency thereof by a factor similar to said predetermined number of output signals for which said period counter means is operative, control means for selectively detecting and operating on information relative to said output means, and transfer means connected between said control means, said frequency dividing means and said converter means whereby the count rate of said converter may be selectively altered by said control means in response to information derived from the signals produced by said frequency dividing means.

8. The combination recited in claim 7 including switching means, said switching means selectively determining which one of said frequency dividing means and said converter means is operatively connected to said control means, said control means operating on information defined by the number of pulses supplied thereto by said frequency dividing means.

References Cited

UNITED STATES PATENTS

| | | | |
|---|---|---|---|
| 3,042,911 | 7/1962 | Paradise et al. | 340—347 |
| 3,263,066 | 7/1966 | Seegmiller | 235—150.5 |
| 3,310,799 | 3/1967 | Ohashi | 340—347 |

MAYNARD R. WILBUR, *Primary Examiner.*

M. K. WOLENSKY, *Assistant Examiner.*

U.S. Cl. X.R.

235—92, 154